US011927891B2

(12) United States Patent
Pandey et al.

(10) Patent No.: US 11,927,891 B2
(45) Date of Patent: Mar. 12, 2024

(54) APPARATUS AND METHODS FOR DETERMINING THE POSITION OF A TARGET STRUCTURE ON A SUBSTRATE

(71) Applicant: ASML Netherlands B.V., Veldhoven (NL)

(72) Inventors: Nitesh Pandey, Eindhoven (NL); Duygu Akbulut, Eindhoven (NL); Alessandro Polo, Arendonk (BE); Sebastianus Adrianus Goorden, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 771 days.

(21) Appl. No.: 16/963,273

(22) PCT Filed: Dec. 20, 2018

(86) PCT No.: PCT/EP2018/086276
§ 371 (c)(1),
(2) Date: Jul. 20, 2020

(87) PCT Pub. No.: WO2019/145101
PCT Pub. Date: Aug. 1, 2019

(65) Prior Publication Data
US 2021/0364936 A1    Nov. 25, 2021

(30) Foreign Application Priority Data
Jan. 26, 2018    (EP) .................................... 18153587

(51) Int. Cl.
*G01N 29/11*      (2006.01)
*G01B 9/02015*    (2022.01)
(Continued)

(52) U.S. Cl.
CPC ....... *G03F 9/7061* (2013.01); *G01B 9/02015* (2013.01); *G01N 29/0681* (2013.01);
(Continued)

(58) Field of Classification Search
CPC . G01N 29/0681; G01N 29/11; G01B 9/02015
See application file for complete search history.

(56) References Cited

U.S. PATENT DOCUMENTS 5,493,403 A    2/1996 Nishi et al.
5,821,424 A    10/1998 Rodriguez
(Continued)

FOREIGN PATENT DOCUMENTS

JP    S58-019556 A    2/1983
JP    S62-095460 A    5/1987
(Continued)

OTHER PUBLICATIONS

International Preliminary Report on Patentability directed to related International Patent Application No. PCT/EP2018/086276, dated Jul. 28, 2020; 8 pages.
(Continued)

*Primary Examiner* — Lam S Nguyen
(74) *Attorney, Agent, or Firm* — Sterne, Kessler, Goldstein & Fox P.L.L.C.

(57) ABSTRACT

A sensor is disclosed, wherein a transducer generates acoustic waves, which are received by a lens assembly. The lens assembly transmits and directs at least a part of the acoustic waves to a target. The lens assembly then receives at least a part of acoustic waves, after interaction with the target. The sensor further comprises an optical detector that comprises at least one optically reflective member located at a surface of the lens assembly, which surface is arranged opposite to a surface of the lens assembly which faces a focal plane of the lens assembly, wherein the at least one optically reflec-
(Continued)

tive member is mechanically displaced in response to the acoustic waves, which are received and transmitted by the lens assembly.

13 Claims, 8 Drawing Sheets

(51) Int. Cl.
*G01N 29/06* (2006.01)
*G03F 7/00* (2006.01)
*G03F 9/00* (2006.01)

(52) U.S. Cl.
CPC ...... *G03F 7/70625* (2013.01); *G03F 7/70633* (2013.01); *G01B 2290/25* (2013.01); *G01N 2291/2697* (2013.01)

(56) References Cited

U.S. PATENT DOCUMENTS

| | | |
|---|---|---|
| 6,477,898 B1 | 11/2002 | Han et al. |
| 6,818,360 B1 | 11/2004 | Phan et al. |
| 6,952,253 B2 | 10/2005 | Lof et al. |
| 6,961,116 B2 | 11/2005 | Den Boef et al. |
| 8,148,682 B2 | 4/2012 | Hotta et al. |
| 8,302,480 B2 | 11/2012 | Maris et al. |
| 9,551,939 B2 | 1/2017 | Mathijssen et al. |
| 2002/0006560 A1 | 1/2002 | van der Schaar et al. |
| 2005/0023434 A1 | 2/2005 | Yacoubian |
| 2006/0210893 A1 | 9/2006 | Van Bilsen |
| 2006/0272419 A1* | 12/2006 | Maris ................ G01N 29/0681 430/5 |
| 2009/0195768 A1 | 8/2009 | Bijnen et al. |
| 2009/0272191 A1 | 11/2009 | Maris et al. |
| 2011/0207328 A1 | 8/2011 | Speakman |
| 2015/0261097 A1 | 9/2015 | Mathijssen et al. |
| 2017/0122913 A1 | 5/2017 | Riviere et al. |

FOREIGN PATENT DOCUMENTS

| | | |
|---|---|---|
| JP | 2001-267224 A | 9/2001 |
| JP | 2010-518396 A | 5/2010 |
| JP | 2011-169766 A | 9/2011 |
| JP | 2014-127921 A | 7/2014 |
| JP | 2015-532465 A | 11/2015 |
| JP | 2017-215556 A | 12/2017 |
| TW | 201140255 A | 11/2011 |
| WO | WO 2011/012624 A1 | 2/2011 |
| WO | WO 2011/093108 A1 | 5/2013 |

OTHER PUBLICATIONS

International Search Report and Written Opinion of the International Search Authority directed to related International Patent Application No. PCT/EP2018/086276, dated Mar. 20, 2019; 11 pages.
Sigalov, E.A., "Vibration Meter of the Mirror Type," Instrument Construction, No. 2, Feb. 1, 1965; pp. 31-33.

* cited by examiner

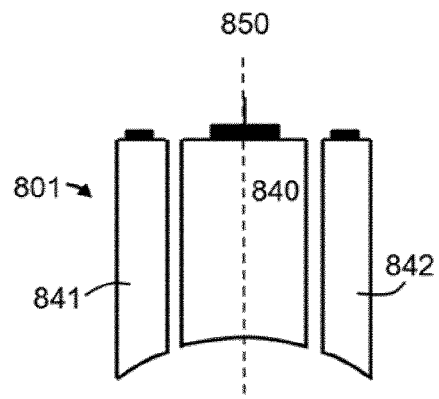
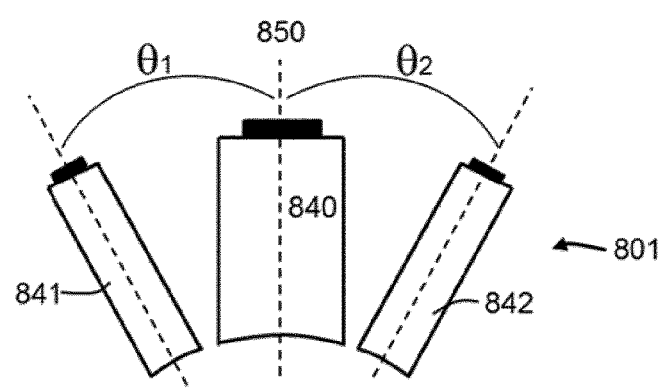
FIG. 9a  FIG. 9b
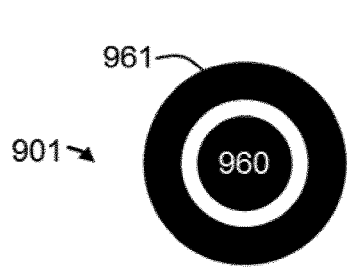
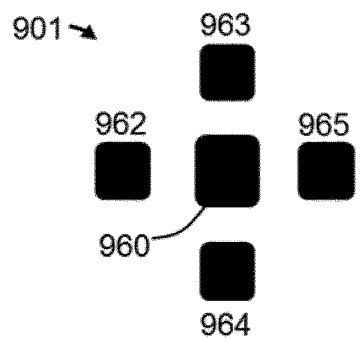
FIG. 10a  FIG. 10b

APPARATUS AND METHODS FOR DETERMINING THE POSITION OF A TARGET STRUCTURE ON A SUBSTRATE

CROSS-REFERENCE TO RELATED APPLICATIONS

This application claims priority of EP application 18153587.3 which was filed on 26 Jan. 2018 and which is incorporated herein in its entirety by reference.

FIELD OF THE INVENTION

This invention relates to metrology systems and more specifically to scanning acoustic microscopes.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (for example a mask) onto a layer of radiation-sensitive material (resist) provided on a substrate (for example a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

The manufacturing of ICs thus involves the creation of a plurality of overlaying patterned layers each having an individual pattern and each layer needs to be aligned as good as possible with respect to other layers. In general, layer-to-layer alignment, i.e., alignment between a first layer and a second layer that overlays the previous layer, is a critical parameter for the functionality and performance of the integrated circuit. A measure for the alignment between layers, or, more generally, the alignment of an individual layer with respect to a reference may be obtained by a metrology tool, such as for example a wafer alignment sensor or an overlay metrology sensor as respectively disclosed in U.S. Pat. No. 6,961,116 and WO 2011/012624. Such a sensor typically uses visible light reflected and/or scattered from metrology marks, for example alignment marks, overlay mark structures or product structures in the individual layers. A plurality of metrology marks are formed during the lithographic manufacturing process of the individual patterned layers and are normally placed in an area surrounding the product structures, which area is also named a scribe lane.

There is a continuing trend of utilizing material layers in the manufacturing process that are not transparent for visible light, for example metal or carbon layers or new chalcogenide type of materials for 3D memory applications. A drawback of these opaque layers is that metrology marks or other structures created in a layer, which is overlaid by an opaque layer, are not detectable or measurable by conventional metrology tools that utilize visible light for detecting such metrology marks or other structures. In other words, the marks or structures are obscured by the overlaying opaque layer.

Scanning acoustic microscopy is used to measure, inspect, and to evaluate manufacturing process steps, as well as to measure alignment features on semiconductor wafers during the IC manufacturing process. An example of a conventional scanning acoustic microscope comprises an acoustic lens with a piezo-electric transducer that creates acoustic waves in response to an optical or electrical signal. The acoustic waves are focussed by the acoustic lens at a desired location on a sample object. The acoustic waves reflected from the object, after having interacted with structures of the sample object, are received by the same acoustic lens that is used to focus the incident acoustic waves or by another acoustic lens. The reflected acoustic waves are at least partly received by one or more other piezo-electric transducers that convert the received acoustic waves into signals, for example electrical signals, from which information is derived that characterizes the structures of the sample object, for example dimensions of the structures.

In order to improve the spatial resolving power of the scanning acoustic microscope, the piezo-electric transducers may be replaced by an assembly of opto-acoustic or acousto-optic materials to enable an optical detection method. The underlying concept of opto-acoustic transducers is characterized by a change of material properties in response to optical or acoustic signals. The opto-acoustic effect or photo-acoustic effect is the phenomenon of creating acoustic waves as a result of light absorption in an object. The reverse effect, i.e., the acousto-optic effect, is characterized by the fact that the presence of acoustic waves in an object changes physical properties of material(s) in the object, for example the refractive index. In these type of acoustic microscopes, the information carried by the acoustic waves is converted into a modulation of a probe light. The probe light is used to measure a change in a property of an opto-acoustic material layer of the transducer assembly, which is caused by acoustic waves impinging the opto-acoustic material layer. US 2009/0272191 A1 discloses an example of such a scanning acoustic microscope including an opto-acoustic transducer assembly.

Although the instantaneous response of the opto-acoustic material to an impinging acoustic signal enables the use of higher frequency pulses of shorter wavelengths that can be used to improve the resolving power of a scanning acoustic microscope, the obtained spatial information may be influenced by the material properties of the acousto-optic transducer.

SUMMARY OF THE INVENTION

The inventors of the present invention have recognized that a disadvantage of an acoustic-optic concept is the indirect translation of an acoustic signal, which carries the spatial information of the feature, into a modulated optical signal. The translation is governed, and hereby limited, by the material response, conversion efficiency, as well as optical transparency of the acoustic-optical material of the transducer. Therefore, it is an object of the invention to provide a metrology system comprising an acoustic microscope utilizing an optical detector that is less sensitive to changes in material properties caused by acoustic waves impinging on the optical detector.

In view of the above, the invention provides a sensor which comprises a transducer configured to generate acoustic waves and a lens assembly configured to receive and direct at least a part of the acoustic waves to a target and to receive at least a part of acoustic waves, after interaction with the target, and an optical detector that comprises at least one optically reflective member located at a surface of the lens assembly, wherein the at least one optically reflective member is arranged to mechanically displace in response to received acoustic waves.

The invention provides for optically sensing and detecting acoustic waves after interaction with a target. The reflected and received acoustic waves provide for a mechanical displacement of at least one of the optically reflective members of the optical detector, which is in contact with the acoustic lens. As a result of the mechanical displacement of the optical reflective member, the optical path length in the optical detector is changed without changing a property of material in the optical detector, such as the refractive index. Thus, the sensor is configured to use acoustic waves to perform imaging operations without utilizing material property changes in the optical detector and therefore information measured by the sensor is less dependent on the material properties of the optical detector.

In an embodiment, the sensor comprises one or more radiation sources, for example one or more laser sources. At least one radiation beams originating from the radiation source is used to interact with at least one optically reflective member, which is located at the surface of the lens assembly, for measuring a mechanical displacement of the at least one optically reflective member.

In an embodiment, the lens assembly comprises a first lens configured to direct at least a portion of the acoustic waves to the target, and a second lens configured to receive at least a portion of acoustic waves diffracted from the target. In this way crosstalk between the different acoustic waves is prevented.

In another embodiment, the lens assembly comprises a plurality of lenses with a common central geometrical axis. The lenses are orientated relative to the central axis. In an embodiment, the orientation of each lens is individually adjustable.

In an embodiment, the sensor comprises at least one radiation source arranged to provide and to direct a reference beam along a radiation beam reference path in the optical detector. The reference beam is used to interferometrically detect a phase shift in the radiation beam configured to measure the mechanical displacement of an optically reflective member.

In an embodiment, the optical detector comprises an optical interferometer configured to detect a mechanical displacement of the at least one optically reflective member by means of one or more radiation beams interacting with the optically reflective member. The detection sensitivity of the optical detector is enhanced by the interferometer configured to cause constructive and/or destructive interference between different radiation beams.

In another embodiment, the optical detector comprises at least one Fabry-Pérot cavity configured to detect a mechanical displacement of the at least one optically reflective member. A radiation beam that traverses a Fabry-Pérot cavity will experience an enhanced interaction with the diffracted acoustic waves. By inserting a dielectric medium in the Fabry-Perot cavity, the diffracted acoustic waves can travel into the cavity, and hereby, the interaction between the radiation beam and the acoustic wave is further enhanced. In this way, the detection sensitivity of the optical detector is improved.

According to an aspect of the invention, there is provided a lithographic system comprising a sensor as set forth herein. The sensor may be used to measure targets to provide position information of the target, which may be used to align a wafer before exposure or to obtain overlay information between two or more material layers.

According to a further aspect of the invention, there is provided a metrology system comprising a sensor as set forth herein. The sensor may be used to measure targets to provide position information of the target, which may be used to obtain overlay information between two or more material layers.

According to an aspect of the invention there is provided a method for obtaining information of a target provided at an object, the method comprising the steps of: irradiating the object with acoustic waves, receiving at least a portion of the acoustic waves reflected and diffracted into higher orders from the target, measuring a mechanical displacement of at least one optically reflective member induced by the received acoustic waves, and deriving characteristics of the target from the measured mechanical displacement.

The method further comprises the step of moving the target and sensor relatively to each other to scan the acoustic waves over the target in at least one direction across a surface of the object.

BRIEF DESCRIPTION OF THE DRAWINGS

Embodiments of the invention will now be described, by way of example only, with reference to the accompanying schematic drawings, wherein like reference numerals designate like elements, in which:

FIGS. 9a and 9b depict schematic views of an acoustic lens assembly utilizing a plurality of lenses;

FIGS. 10a and 10b are top views showing a plurality of transducers and/or receiving elements of an embodiment of a lens assembly;

DETAILED DESCRIPTION

In the present document, the terms "radiation" and "beam" are used to encompass all types of electromagnetic radiation, including ultraviolet radiation (for example with a wavelength of 365, 248, 193, 157 or 126 nm) and EUV (extreme ultra-violet radiation, for example having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
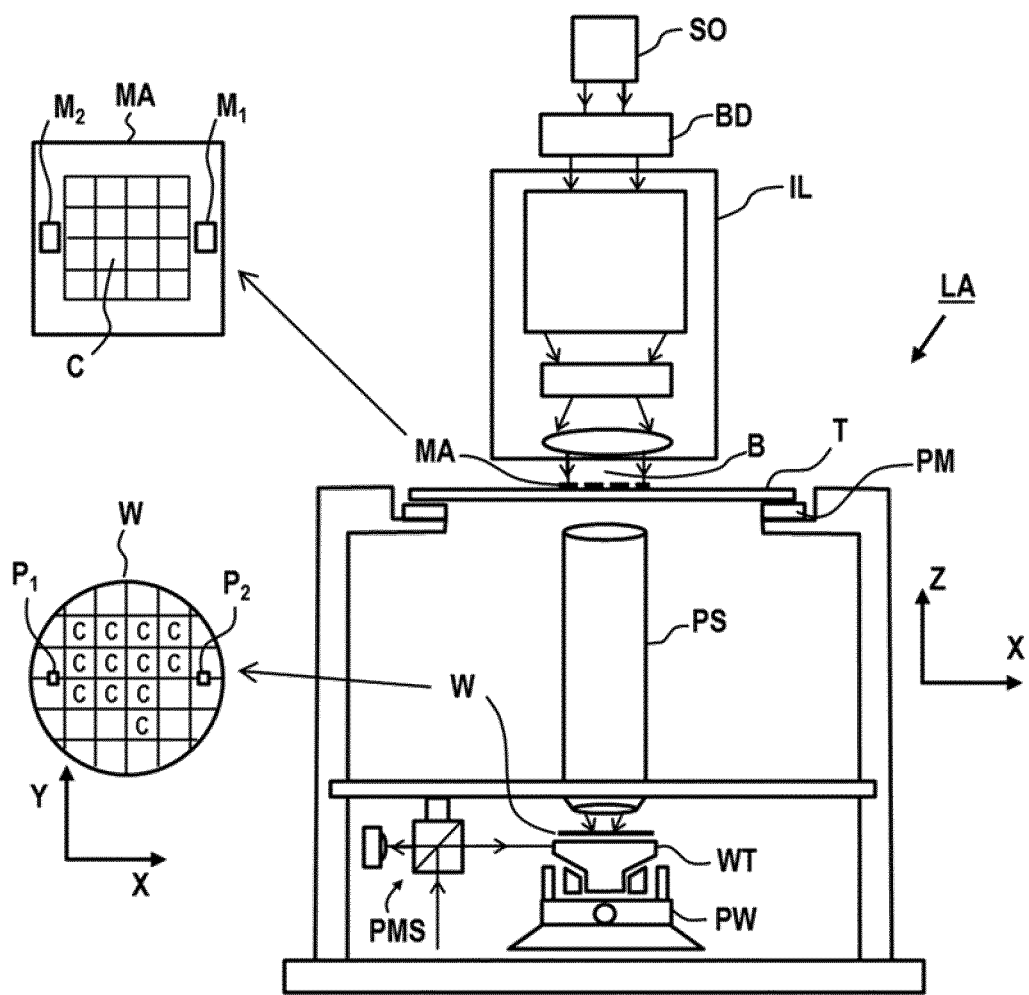
FIG. 1 depicts a schematic lithographic apparatus.

FIG. 1 schematically depicts a lithographic apparatus LA. The lithographic apparatus LA includes an illumination system (also referred to as illuminator) IL configured to condition a radiation beam B (for example UV radiation, DUV radiation or EUV radiation), a mask support (for example a mask table) MT constructed to support a patterning device (for example a mask) MA and connected to a first positioner PM configured to accurately position the patterning device MA in accordance with certain parameters, a substrate support (for example a wafer table) WT constructed to hold a substrate (for example a resist coated wafer) W and connected to a second positioner PW configured to accurately position the substrate support in accordance with certain parameters, and a projection system (for example a refractive projection lens system) PS configured to project a pattern imparted to the radiation beam B by patterning device MA onto a target portion C (for example comprising one or more dies) of the substrate W.

In operation, the illumination system IL receives a radiation beam from a radiation source SO, for example via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, for example water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus LA, for example a part of the projection system PS or a part of a system that provides the immersion liquid. The measurement stage may move beneath the projection system PS when the substrate support WT is away from the projection system PS.

In operation, the radiation beam B is incident on the patterning device, for example mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, for example so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus LA may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference. The alignment sensor scans each mark optically with a spot of radiation to obtain a periodically varying signal, such as a sine wave. The phase of this signal is analysed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose. Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 2:
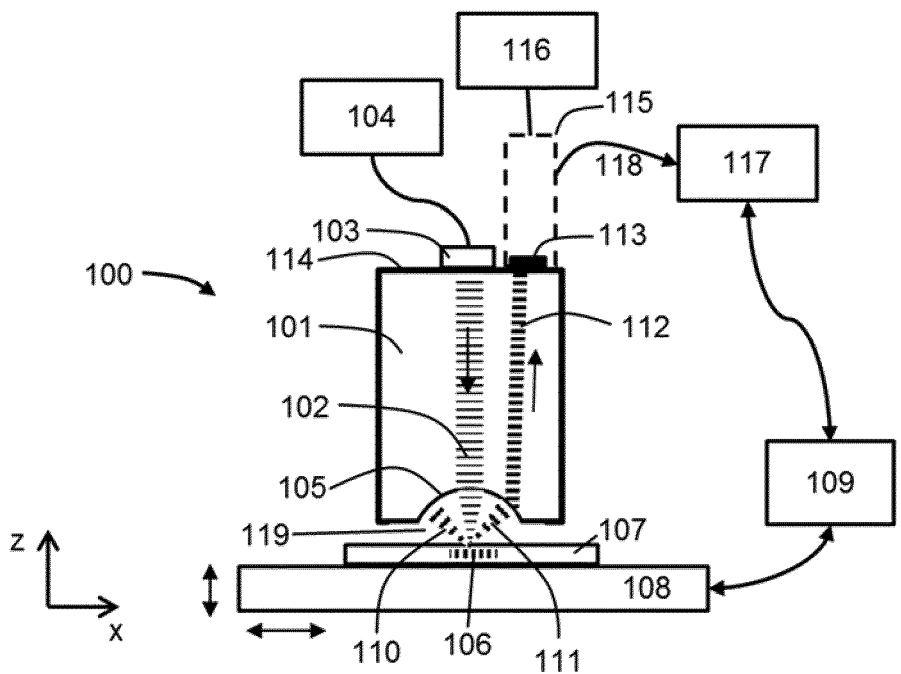
FIG. 2 depicts a schematic view of a sensor in accordance with the invention that may be applied in the lithographic apparatus of FIG. 1.

The invention is directed to means and methods for determining a change in phase of a measurement radiation beam by measuring at localized positions on a sample or substrate. The general application is illustrated in FIG. 2. Sensor 100 depicted in FIG. 2 comprises a lens assembly 101 that receives and transmits acoustic waves 102 that are generated by a transducer 103. The transducer 103, which may be for example an opto-acoustic or a piezo-electric transducer, generates acoustic waves in response to a signal provided by a pulse generator 104. In certain embodiments, the pulse generator 104 may be a pulsed radiation source, for example a pulsed laser to excite an opto-acoustic transducer, wherein the transducer 103 generates acoustic waves (sound or pressure waves) in response to the signal of the pulsed radiation source 104.

It may be convenient to use an electric signal instead of a pulsed laser to excite the transducer 103. For example, pulse generator 104 comprises an electric oscillator that generates an pulsed electric signal to excite a piezo-electric transducer 103, which converts electric energy into acoustic energy.

Acoustic waves 102, also referred to as acoustic beam, that are generated by the opto-acoustic or piezo-electric transducer 103 are transmitted and are projected on a target 106 by the lens assembly 101.

FIG. 2 illustrates an embodiment in which at least a part of a second surface 105 of the lens assembly 101 that faces the target 106 has a generally concave shape. By this configuration, the concave surface 105 operates as a lens for acoustic waves, which may be used to focus acoustic waves onto an area of interest at a focal plane of the lens assembly. In an embodiment, the target 106 may be provided on a substrate 107, which is held on a substrate support 108. With the aid of a position controller 109, the target 106 may be positioned relative to the lens assembly 101 or more generally the sensor 100 by changing a position of the substrate support 108. Hereby, one or more targets 106 can be scanned by the acoustic waves 102 in the plane that is parallel to the target, for example in the horizontal or xy-plane, and/or scanned in the direction perpendicular to the target plane, for example in the vertical or z-direction.

A liquid (not shown in view of clarity) may be provided in an area 119 as a coupling medium between the lens assembly 101 and the target 106 to support transmission of acoustic waves between the elements. The liquid in the area 119 may be conditioned by means of supply and/or extraction channels. For example, the purity level as well as the temperature of the liquid may be controlled in order to operate the sensor in a stable mode.

In an embodiment, the lens assembly 101 may have a tapered shape, wherein the second surface 105, which may be in contact with the liquid, has smaller dimensions than the dimensions of the lens surface 114 that is arranged opposite to the second surface 105. It will be appreciated by the skilled person, that a reduced surface results in a reduced liquid volume, which may be beneficial for controlling the liquid within area 119.

One or more targets 106, for example alignment or metrology marks, may be provided on a surface of the sample or substrate 107 and which may be detectable by sensors operating in the visible light range. In another example, one or more targets 106 are overlaid by one or more layers. In some occasions, the overlaid layers are transparent for visible light and detection of the marks 106 by the sensors operating in the visible light range is still possible. However, there is a trend of utilizing layers that are not transparent for visible light, for example layers comprising metal or a-carbon, and the targets 106 become obscured for detection by sensors that operate in the visible wavelength range. In this case, the obscured targets 106 may be detected, for example, by means of an acoustic microscope utilizing acoustic waves (ultrasonic waves). In the embodiment shown in FIG. 2, acoustic waves 102 transmitted by the lens assembly 101 interact with the target 106, for example an alignment mark comprising a diffraction grating, on the substrate 107 (the target 106 may be provided on the substrate surface or it may be buried underneath a material layer, for example an opaque layer) and thereafter at least a part of the diffracted acoustic waves 110, 111 is received by the lens assembly 101.

Acoustic waves behave in a similar way as optical waves when interacting with a periodic pattern, or a grating. In this perspective, the acoustic waves, which are projected on a target having a grating structure, will be diffracted. The diffraction results in a spatial intensity distribution of diffracted acoustic waves. In general, such a spatial diffraction intensity distribution is described by diffraction orders. In the embodiment of FIG. 2, the acoustic waves 102 transmitted by the lens assembly 101 and projected onto the target 106, which is in this example a grating structure, are diffracted by the grating structure, for example a metrology mark, resulting in first order diffracted acoustic waves 110 and 111, representing the −1 and +1 diffraction orders, respectively. A part of the +1 order diffracted acoustic waves 111 is, in this example, received by the lens assembly 101 resulting in diffracted acoustic waves 112 transmitted via the lens assembly 101 to an optical detector 115, which comprises an optically reflective member 113. The optically reflective member is, in this embodiment, applied to a first surface 114 of the lens assembly 101, which first surface 114 is arranged opposite to the second surface 105 of the lens assembly 101 facing a focal plane of the lens assembly 101. In an embodiment, the optically reflective member 113 is a reflective layer deposited on the first surface 114 of the lens assembly 101 or a mirror rigidly connected to the lens assembly 101. In an embodiment the reflective member 113 is part of an optical arrangement that forms an optical detector 115. Diffracted acoustic waves 112 are transmitted by the lens assembly 101 towards the optically reflective member 113. In response to the diffracted acoustic waves 112, the optical reflective member 113 will vibrate and these vibrations or induced mechanical displacements of the optically reflective member 113 are then detected by the optical detector 115. At least one radiation source 116, which is connected to the optical detector 115, generates a radiation beam, which may be used to detect mechanical displacements of an optically reflective member 113.

In the embodiment shown in FIG. 2, a processor 117 receives a detected signal 118 from the optical detector 115 representing the vibrations of the optically reflective member 113 that are induced by the impinging diffracted acoustic waves 112, and which may be used for further processing, analysis, or control of an apparatus comprising the sensor 100, for example a lithographic system LA or a metrology system. In an embodiment a position dependent measurement of one or more targets 106 is executed (scanning of the target) by controlling a position of the substrate support 108 relatively to the sensor 100, for example via a controller 109. The properties of the diffracted acoustic waves 112 received by the optical detector 115 via induced vibrations of the reflective optical element 113, are dependent on the local interaction of the acoustic waves 102 with the target 106. In an embodiment a spatial image of one or more targets, for example metrology marks, is generated by combining information obtained by the sensor 100, and which is processed and send as output by the processor 117, with information of the position of the one or more targets 106. It should be understood that further processing of the obtained spatial images, which typically involves a computer assembly, may be used to obtain target position information for alignment purposes within, for example, a lithographic apparatus LA, or may be used to obtain target characteristics in a metrology system to obtain overlay data between multiple layers.

Figure 3:
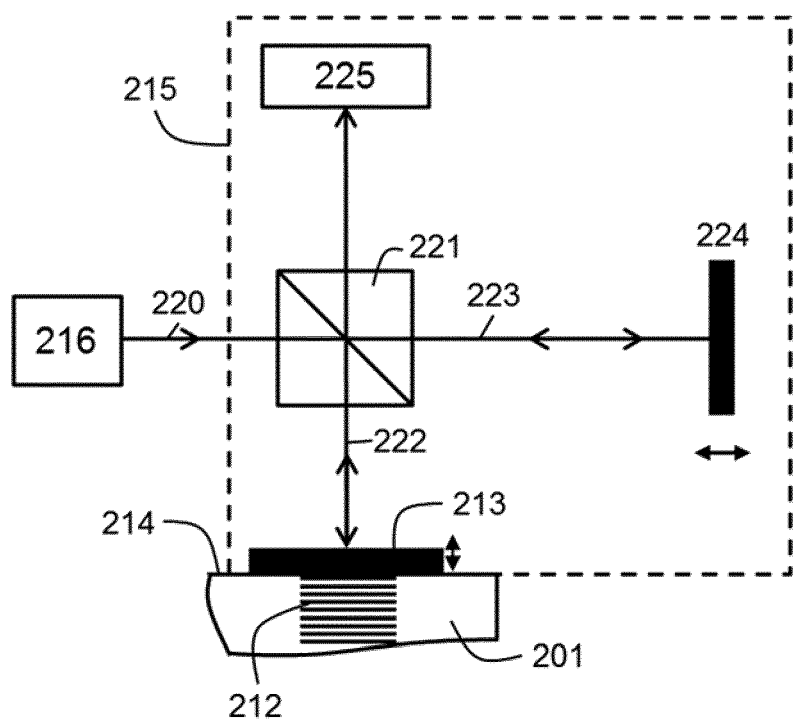
FIG. 3 depicts a schematic view of an optical detector suitable for use in the sensor of FIG. 2.

An exemplary embodiment of the optical detector 215, as may be applied in the sensor 100 as shown in FIG. 2, is depicted in FIG. 3. At least one radiation source 216, which is connected to the optical detector 215, generates a radiation beam 220, which may be used to detect mechanical displacements of an optically reflective member 213. It will be appreciated by the skilled person that multiple optically reflective members 213 may be used. In this embodiment radiation received by the optical detector 215 is split by a beam splitter 221 into a first radiation beam 222, or also called a probe beam, and a second radiation beam 223, or also called a reference beam. The probe beam 222 may be projected on the optically reflective member 213 provided on the first surface 214 of the lens assembly 201. In this embodiment the reference beam 223 is projected onto a mirror 224 via, in this example, a beam splitter 221. In an embodiment, the mirror 224 is movable such that an optical path length of the reference radiation beam 223 is adjustable. Herewith providing an adjustable radiation beam reference path. The probe beam 222 and the reference beam 223 both are reflected back onto the beam splitter 221, which subsequently directs these to a detector 225, for example a light sensitive detector such as a photodiode or an image sensor.

In an embodiment the first and the second radiation beams 222, 223 spatially and/or temporally overlap at the detector 225. There is a phase difference between the probe radiation beam 222 and the reference radiation beam 223 depending on the difference in optical path length between the probe beam 222 and the reference beam 223. The position of the mirror 224 may be adjusted such that both radiation beams overlap (spatially as well as temporally) resulting in constructive or destructive interference depending on the phase difference between both radiation beams.

The intensity of the diffracted acoustic waves 212 (or in general the amplitude of pressure waves) received by the optical detector 215 determines an amplitude of the mechanical displacement of the optically reflective member 213. By scanning over, for example, a metrology mark with a periodic pattern, the amplitude of the diffracted acoustic waves 212 oscillates periodically according to the physical properties of the scanned metrology mark during the lateral scan. Due to the mechanical displacements of the optical element 213, in response to received acoustic waves 212, the optical path length of the probe beam 222 changes. The path length change may correspond to a phase shift of the probe beam 222 relative to a reference beam 223. By measuring the phase shift as a function of the position of the mark, spatial information or more general the characteristics of the target may be obtained.

The radiation source 216, which generates a radiation beam 220 that may be used to sense the mechanical displacements, may comprise one or more light sources each with a constant wavelength or may comprise one or more light sources with variable wavelength. Radiation source 216 may be tuneable in wavelength, for example a radiation source comprising a supercontinuum light source with a tuneable optical filter. In addition, the radiation source 216 may operate in a continuous wave mode or in a pulsed mode.

The optically reflective member 213 may be a passive element in the sense that its optical properties, for example refractive index, do not change under influence of acoustic stimulation.

Figure 4:
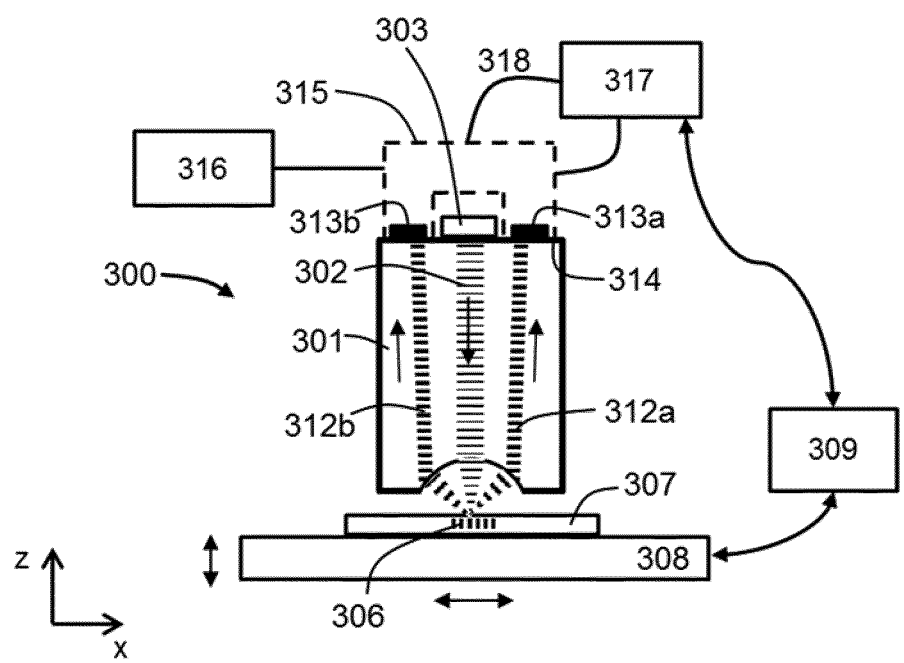
FIG. 4 depicts a schematic view of an embodiment of a sensor in accordance with the invention that may be applied in the lithographic apparatus of FIG. 1.

An alternative embodiment of a sensor 300 of the invention is depicted in FIG. 4. Acoustic waves 302 generated by a transducer 303 in response to an excitation source (not shown for clarity) are received and transmitted by a lens assembly 301 onto a target 306. In this embodiment, at least a part of the acoustic waves 302 are diffracted after interaction with the target 306, for example diffraction grating, and at least a part of the diffracted waves 312a, 312b are received by the lens assembly 301. In this example, two complementary diffraction orders 312a and 312b are illustrated, for example the −1 and the +1 diffraction order, respectively. Each beam of diffracted acoustic waves 312a, 312b may individually cause mechanical displacements of optically reflective members 313a and 313b. Herewith, each optically reflective member 313a, 313b may correspond to a specific diffraction order, which may be beneficial in the analysis of the measured mark.

In the embodiment shown in FIG. 4, the optically reflective members 313a and 313b are members of an optical detector 315, which is arranged to detect mechanical displacements of the optically reflective members 313a, 313b induced by the diffracted acoustic waves 312a and 312b. The optical detector 315 may be considered to be a configuration of multiple arrangements of the optical detector 315 as depicted by FIG. 3. It will be appreciated by the skilled person that multiple radiation sources 316 may be used. The outputs of the radiation sources 316 may differ in wavelength, polarization and/or operation mode, for example pulsed or continuous wave.

In an embodiment a processor 317 is coupled to the optical detector 315 to receive measurement information signals 318 obtained by the optical detector 315 to be used for further analysis and/or control. A controller 309 may be used to control and to position a substrate support 308 which holds a substrate 307.

Figure 5A:
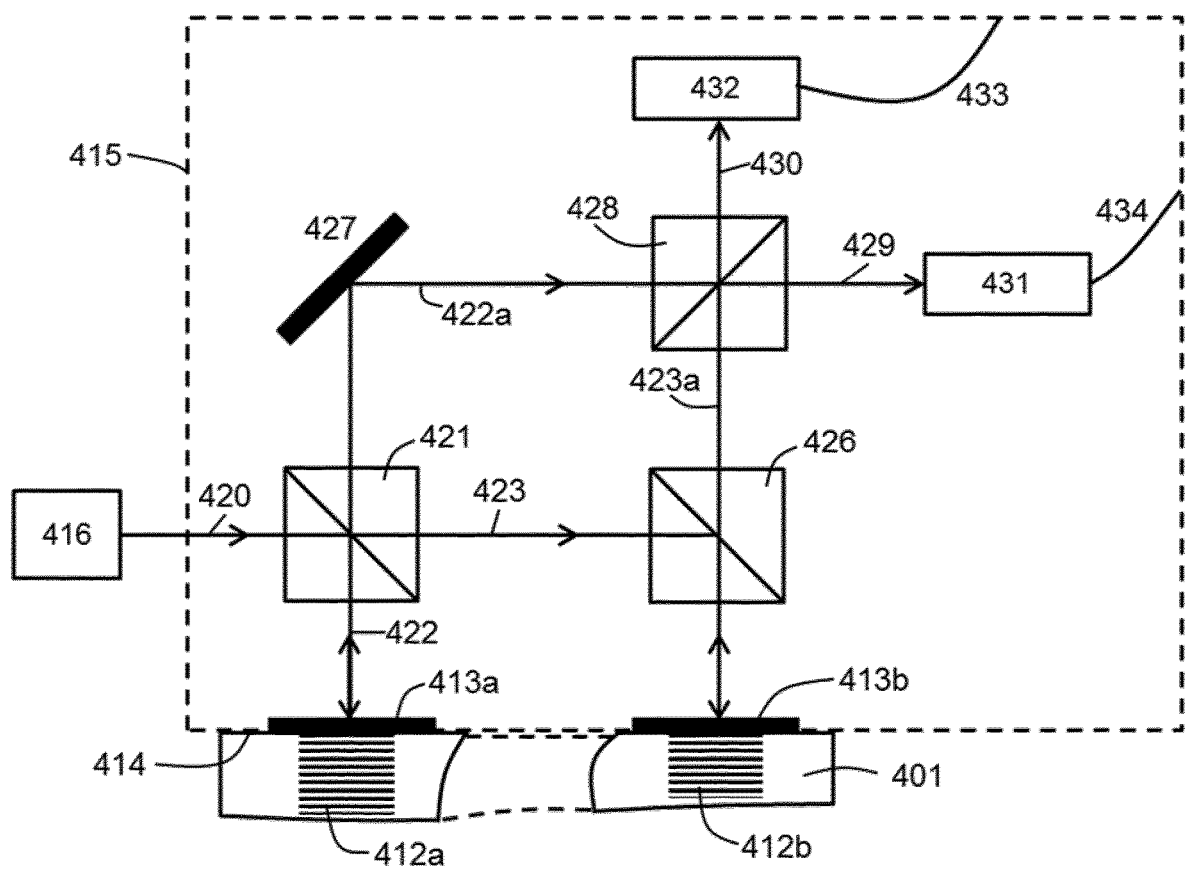
FIG. 5a depicts a schematic view of an embodiment of an optical detector suitable for use in the sensor of FIG. 4.

FIG. 5a illustrates an embodiment of an optical detector 415 comprising multiple optically reflective members, 413a and 413b, and forming an optical interferometer, that may be used in the sensor 300 as depicted in FIG. 4. A radiation beam 420 generated by a radiation source 416 propagates into a first optical component 421, for example a beam splitter, configured to split the radiation beam 420 into a first radiation beam 423 and a second probe radiation beam 422. The first radiation beam 423 propagates into a second optical component 426 where it is redirected towards the optically reflective member 413b provided on a first surface 414 of the lens assembly 401. The second outgoing probe radiation beam 422 is directed by the first optical component 421 towards the reflective optical element 413a provided on the surface 414 of the lens assembly 401. It will be appreciated by the skilled person that additional optical components, for example lenses and/or mirrors, may be used to direct and to configure the probe radiation beams 422, 423.

The optically reflective members 413a and 413b may experience a mechanical displacement stimulated by the diffracted acoustic waves 412a and 412b received by the lens assembly 401 after interaction with a target. The mechanical displacement or vibration of the reflecting members 413a, 413b may translate into a phase shift of the probe radiation beams 422, 423 reflected from the optically reflective members 413a, 413b. In the embodiment shown by FIG. 5a, the second probe radiation beam 422 is retro-reflected by reflective member 413a and then propagates via the first optical component 421 and mirror 427 (illustrated by reflected radiation beam 422a) into a third optical component 428, for example a beam splitter. The first probe radiation beam 423 is retro-reflected by reflective member 413b and propagates via the second optical component 426 into the third optical component 428, as is illustrated by reflected radiation beam 423a. The third optical component 428 is configured to split each incoming radiation beam in two outgoing radiation beams 429, 430. Hereby, each outgoing radiation beam 429, 430 is a superimposed combination of portions of reflected radiation beams 422a and 423a. The outgoing radiation beams 429 and 430, or superimposed radiation beams, are projected onto one or more detectors 431 and 432, for example light sensitive detectors such as photodiodes or image sensors, wherein the superimposed radiation beams 429, 430 are converted into electric signals 433 and 434 for further analysis.

To obtain constructive or destructive interference between the split portions of reflected radiation beams 422a and 423a at the surface of the detectors 431 and 432, there should be at least some spatial and temporal overlap between the split portions of reflected radiation beams 422a, 423a. Consider two spatially and temporally overlapping radiation beams with a relative phase shift $\Delta\varphi$, for example, caused by a difference in optical path length between both radiation beams; the interference signal detected by the first detector 431 may be proportional to $$\sim \cos^2 \frac{\Delta\varphi}{2},$$

and the interference signal detected by the second detector 432 may be proportional to $$\sim \sin^2 \frac{\Delta\varphi}{2}.$$

Aforesaid optical path length difference between two radiation beams may result from the mechanical displacement of the optically reflective members 413a and 413b, which may be induced by the diffracted and received acoustic waves 412a, 412b. The information carried by the diffracted acoustic waves 412a, 412b is successively translated into an intensity modulation of the first and second radiation beams 429, 430 detected by the first and second detectors 431, 432.

Figure 5B:
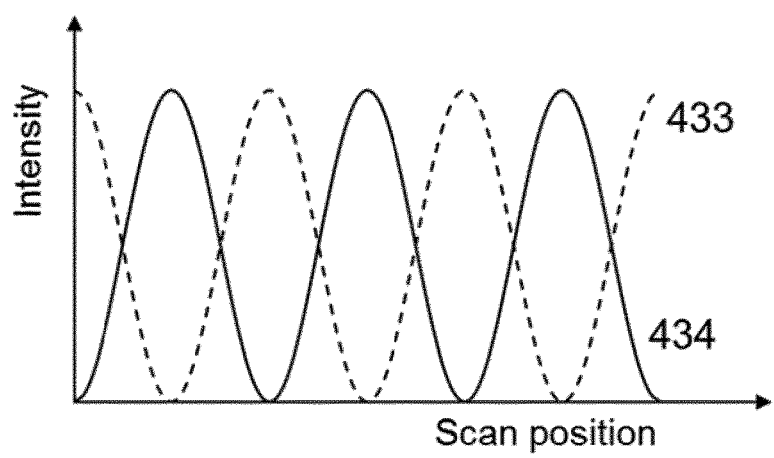
FIG. 5b shows illustrative waveforms detected by the sensor.

FIG. 5b shows an exemplary intensity plot of first and second detector output signals 433, 434 of the first and second detector 431, 432, respectively, when, for example, a target 306 with a periodic pattern is scanned by the sensor 300. Constructive and destructive interference between the reflected radiation beams 422a and 423a cause an alternating behaviour of output signals 433 and 434.

Figure 6:
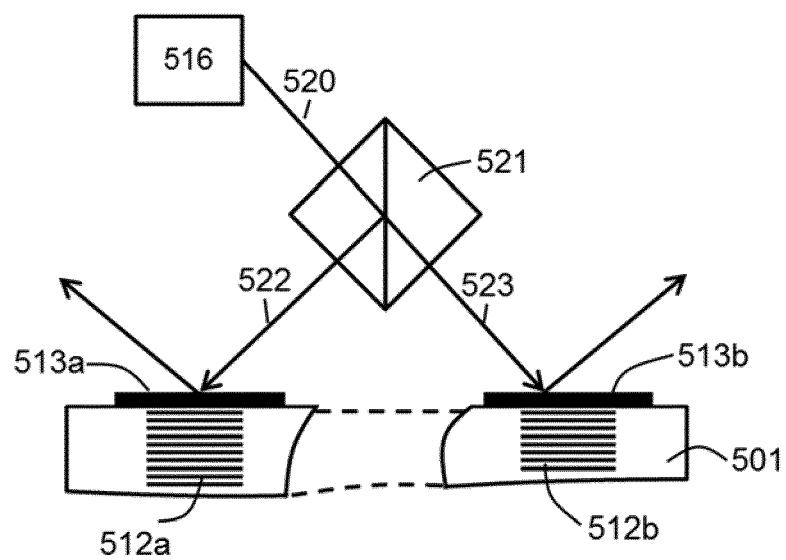
FIG. 6 depicts a schematic view of an embodiment of an optical detector according to the invention.

FIG. 6 illustrates an alternative embodiment for illuminating at least a first and a second optically reflective member 513a and 513b located on a first surface 514 of a lens assembly 501, which may be used in the optical detector 415 as is illustrated by FIG. 5a. In this embodiment, a radiation beam 520 that is generated by a radiation source 516 is split by an optical component 521 into a first probe radiation beam 522 and a second probe radiation beam 523. The first probe radiation beam 522 is projected onto the first optically reflective member 513a, which may be used to measure a mechanical displacement in response to a first diffracted acoustic wave 512a. The second probe radiation beam 523 is projected onto the second optically reflective member 513b to sense the mechanical displacement in response to a second acoustic wave 512b. Both first and second probe radiation beams 522, 523 may have an optical path that does not coincide with the normal of the reflective surface of the optically reflective members 513a, 513b. Subsequently, both probe radiation beams 522, 523 are not retro-reflected onto optical component 521 and propagate via an optical path that differs from the optical path upon reflection at optically reflective members 513a and 513b. This embodiment may be advantageous for constructing an optical detector in which the illumination and the detection branch are separated, in order to supress internal crosstalk between both branches.

Figure 7A:
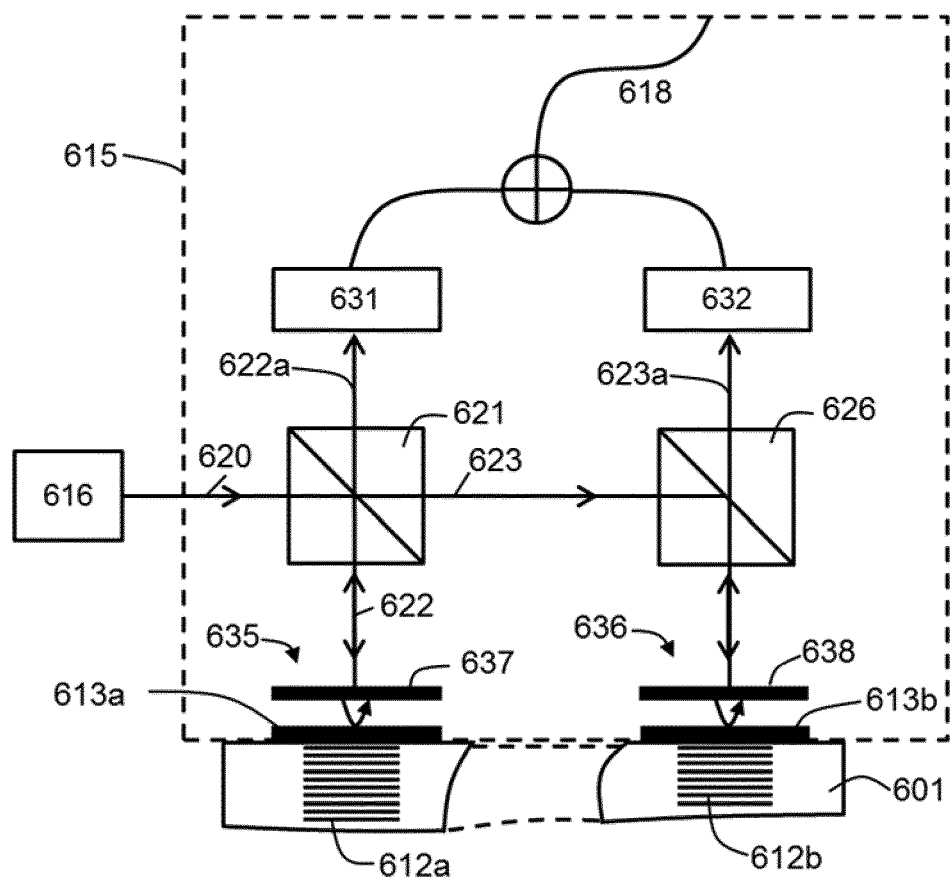
FIG. 7a depicts a schematic view of an embodiment of an optical detector according to the invention.

FIG. 7a illustrates an embodiment an interferometric optical detector 615 comprising two Fabry-Pérot cavities 635, 636, which may be used in the sensor 300 as illustrated in FIG. 4. The Fabry-Pérot cavities 635, 636 are used to enhance the interaction of a first diffracted acoustic wave 612a and a second diffracted acoustic wave 612b with a first probe radiation beam 622 and a second probe radiation beam 623, or also called probe beams. Fabry-Pérot cavities 635 and 636 comprise optically reflective members 613a and 613b, which are arranged on a lens array 601, and reflective objects 637 and 638, respectively. The reflective objects 637, 638 are, for example, mirrors with a reflectivity of 90% or higher. A typical Fabry-Pérot cavity may have a quality factor (Q) of 100 or more, which essentially means that radiation traverses the Fabry-Pérot cavity 100 times or more. Effectively, the interaction of radiation with acoustic waves is enhanced by this factor, and hereby improving the detection sensitivity of the interferometric optical detector 615. The interaction can be further enhanced by tuning or matching the wavelength of the probe radiation beams 622, 623 in resonance with the cavity. The same may be obtained by matching at least one of the geometrical dimensions of the cavity in a direction along an optical axis, for example the cavity length that determines the optical roundtrip time within the cavity, to an integer of the radiation half-wavelength.

In another embodiment the optical detector 615 may comprise more than two Fabry-Pérot cavities. For example, the optical detector 615 may comprise Fabry-Pérot cavities arranged both in the x-direction and in the y-direction to detect acoustic waves diffracted from marks with different orientations within the xy-plane. In another example, three or more Fabry-Pérot cavities are arranged along the same axis.

Fabry-Pérot cavities 635 and 636 may comprise mirrors, for example metallic mirrors with a reflectivity of 99%, with a dielectric material in between, such that an acoustic wave, which is diffracted by a target, may travel into the Fabry-Pérot cavity. It will be appreciated by the skilled person that the spacing between two reflective members, for example between optically reflective member 613a and reflective object 637, may correspond to half a wavelength of the acoustic wave (or generally with an odd number of half a wavelength) and/or may be on an edge of an optical resonance of the radiation used to probe the cavity, such that the reflectivity of the cavity changes maximally as an acoustic wave passes through.

The wavelength of a radiation beam 620 generated by a radiation source 616 may be tuned to the cavity length of the Fabry-Pérot cavity 635 and/or 636 to enhance the interaction of the diffracted acoustic waves 612a, 612b with the probe radiation beams 622, 623. By inserting a piezoelectric material in the Fabry-Pérot cavity and by applying a voltage to the piezoelectric material, the cavity length can be changed to create a resonant cavity for the acoustic waves 612a, b as well as for the probe radiation beams 622, 623.

In the embodiment shown by FIG. 7a, the reflected radiation beams 622a and 623a, which have interacted with the diffracted acoustic waves 612a and 612b, are projected on detectors 631 and 632, respectively. Each detector, which may be for example a light sensitive detector such as a photodiode or an image sensor, detects a single radiation beam that may correspond to a single diffraction order of the diffracted acoustic wave 612a or 612b. It could be advantageous to process output signals of each detector 631, 632 separately, for example, to analyse the response of a single detection branch, i.e., a combination of a single Fabry-Pérot cavity with a single detector. In another embodiment, output signals from both detectors 631, 632 may be combined into a single channel 618 before it is received by a processor for further processing.

Figure 7B:
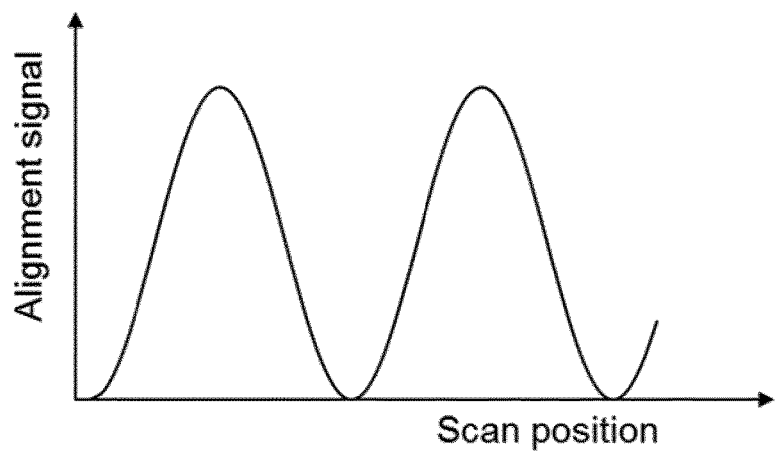
FIG. 7b shows an illustrative waveform detected by the sensor.

FIG. 7b shows an example of a detector signal 618 as a function scan position on a target with a periodic pattern, for example an alignment mark. Constructive and destructive interference between the reflected radiation beams 622a and 623a cause the detector signal 618 to alternate.

One skilled in the art will appreciate that the aforementioned embodiments of the Fabry-Pérot cavity may also be used in the optical detectors 115 and 215 as illustrated by FIGS. 2 and 3, respectively.

Figure 8:
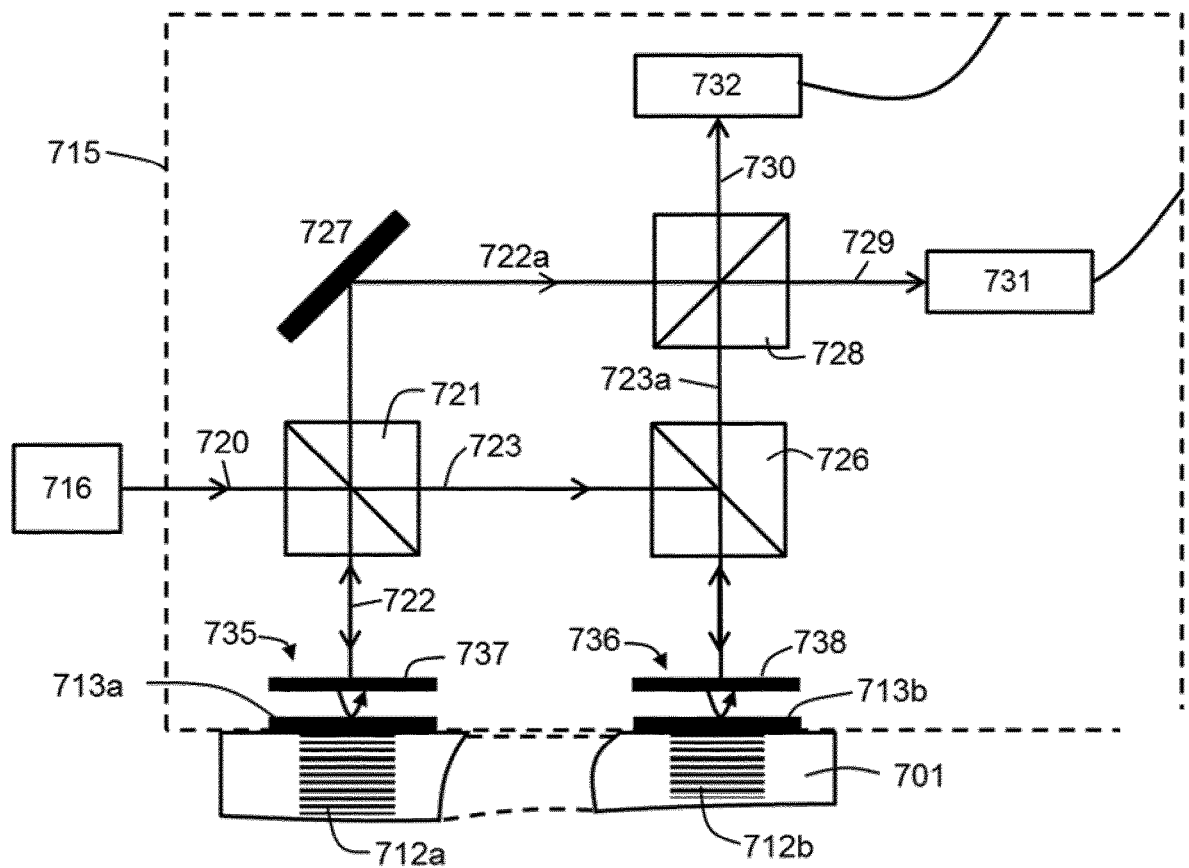
FIG. 8 depicts a schematic view of an embodiment of an optical detector according to the invention.

FIG. 8 depicts an embodiment of an optical detector 715 comprising an interferometer, as illustrated in FIG. 5a, further comprising two Fabry-Pérot cavities (735 and 736) as optical members. Aforesaid advantages of using Fabry-Pérot cavities in a detection branch of an optical detector are also applicable here. A difference with the embodiment illustrated in FIG. 7a, is that first and second superimposed radiation beams 729, 730 detected by first and second detectors 731, 732 in this embodiment are a superposition of at least two reflected radiation beams. Depending on the relative phase difference between reflected radiation beams 722a, 723a, for example caused by a difference in optical path length between both radiation beams, the radiation beams interfere constructively or destructively at the detectors 731, 732. When laterally scanning a periodic pattern, similar alternating signals as shown in FIG. 5b may result with the difference that the detection sensitivity of the optical detector 715 is enhanced by the two Fabry-Pérot cavities 735, 736.

Two embodiments of a lens assembly 801 that may be used in the sensor 100 and 300 as illustrated in FIGS. 2 and 4, respectively, are depicted in FIGS. 9a and 9b. In both embodiments, the lens assembly 801 comprises a plurality of lenses 840-842 in which a first lens, which is configured to receive and to transmit acoustic waves towards a target, is provided separate from a second lens, which is configured to receive and to transmit acoustic waves that are diffracted from the target, in order to avoid crosstalk between the waves that propagate towards and from the target. For example, crosstalk between two acoustic waves that propagate in the same lens could be caused by reflections within the lens (internal reflections).

In the embodiment shown in FIG. 9a, the lens assembly 801 comprises three lenses 840, 841, 842 arranged parallel to a common geometrical or central axis 850. The central lens 840, in this embodiment, is arranged to direct acoustic waves towards a target. The outer lenses 841 and 842 are arranged to receive at least a part of the waves diffracted by the target. For some embodiments, it may be convenient to use less or more lenses.

FIG. 9b shows an embodiment of a lens assembly 801 comprising a central lens 840 and two outer lenses 841 and 842. A first outer lens 841 and a second outer lens 842 are tilted relative to a central axis 850 with a first angle θ1 and a second angle θ2, respectively. The central lens 840 is orientated along the central axis 850 and, in this example, is arranged to direct acoustic waves towards a target. The two outer lenses 841, 842 are then arranged to receive at least a part of the acoustic waves that are diffracted by the target.

In an embodiment the tilt, or more general the orientation, of the first lens 841 and the second lens 842 may be adjustable relatively to the central lens 840 and or central axis 850. The first θ1 and second angle θ2 may be equal or different. Herewith, the first lens 841 may receive one or more diffraction orders that differ from the diffraction orders received by the second lens 842. This enables selective detection of the diffraction orders.

To receive the conjugant diffraction orders, for example the −1 and +1 diffraction order, it may be convenient that the first 81 and second 82 angle are equal.

In another embodiment, one of the outer lenses, for example first lens 841, is used to receive and to transmit acoustic waves to a target, whereas the other lenses 840, 842 are used to receive at least a part of the waves diffracted by the target. In the embodiment, second lens 842 may receive the zeroth diffracted order and central lens 840 may receive the −1 diffracted order of the acoustic wave that has interacted with the target.

Aforementioned embodiments and illustrations describe two-dimensional representations of the invention. It will be appreciated by the skilled person that the sensor is not limited to a two-dimensional orientation of the embodiment. In the exemplary illustration shown by FIG. 2, the acoustic wave 102 is diffracted in the xz-plane by the target 106 comprising a grating structure with a periodic pattern. The actual diffraction pattern and diffraction direction is determined by the orientation of the grating. Therefore, the diffraction pattern of the diffracted acoustic wave 102 may also direct or propagate in the y-direction depending on the target configuration.

FIG. 10a shows an illustrative top view of a lens assembly 901 that may be used in the sensors 100 and 300 as illustrated by FIGS. 2 and 4, respectively. For reason of clarity, a single inner transducer 960 and a single outer optically reflective member 961 are shown. Inner transducer 960 and outer optically reflective member 961 are arranged concentric on the lens assembly 901, preferably inner transducer 960 and outer optically reflective member 961 are arranged coaxially with respect to each other and to the central axis of the lens assembly 901. The location where one or more radiation beams interact with and reflect on the outer optically reflective member 961 may depend on the target, for example depending on the orientation of the diffraction pattern. In the embodiment, a single lens or a plurality of coaxial lenses may be used that are mechanically connected to the inner transducer 960 and outer optically reflective member 961.

Crosstalk between different diffraction orders may occur when a single lens 901 with a single optically reflective member 961 is used to sense the full spatial distribution of acoustic waves that are diffracted by the target. Crosstalk could occur when, for example, both the −1 and +1 diffraction order induce mechanical displacements of the optically reflective member 961. To prevent or reduce crosstalk between the different diffraction orders, a plurality of individual optically reflective members may be used, which are distributed over one or more lenses. In an exemplary embodiment as illustrated by FIG. 10b, the lens assembly 901 comprises four optically reflective members 962-965. Each of the reflective optical elements 962-965 may interact with, and hereby may correspond, or correlate, to a specific set of diffracted acoustic waves. First optically reflective member 962 and second optically reflective member 965 may be stimulated by acoustic waves that correspond to the −1 and +1 diffraction orders, respectively, of an acoustic wave that is diffracted by a target with a grating pattern oriented in the x-direction. In analogy, a third optically reflective member 963 and a fourth optically reflective member 964 may correlate to the −1 and +1 diffraction order of an acoustic wave, which is diffracted by a target with a y-oriented grating.

The illustrative top view as is presented by FIG. 10b may correspond to a top view of the embodiments shown in FIG. 9a and/or 9b. It may be convenient to make the transducer and optically reflective members interchangeable, to build in more flexibility for imaging a target. In an exemplary embodiment, shown by FIGS. 10a and 10b, acoustic waves are generated by a transducer 962 and optically reflective members 960, 963-965 are members of an optical detector, which may experience mechanical displacements by diffracted acoustic waves.

One skilled in the art will appreciate that the aforementioned embodiments may comprise more than one transducer. In an example of a lens assembly 901, which comprises two transducers 962, 964 and three optically reflective members 960, 963, 965, may be used to scan multiple or a set of targets with different grating orientations. Herewith, different signals, for example with different frequencies, may be provided by one or more pulse generators to excite the transducers.

Figure 11A:
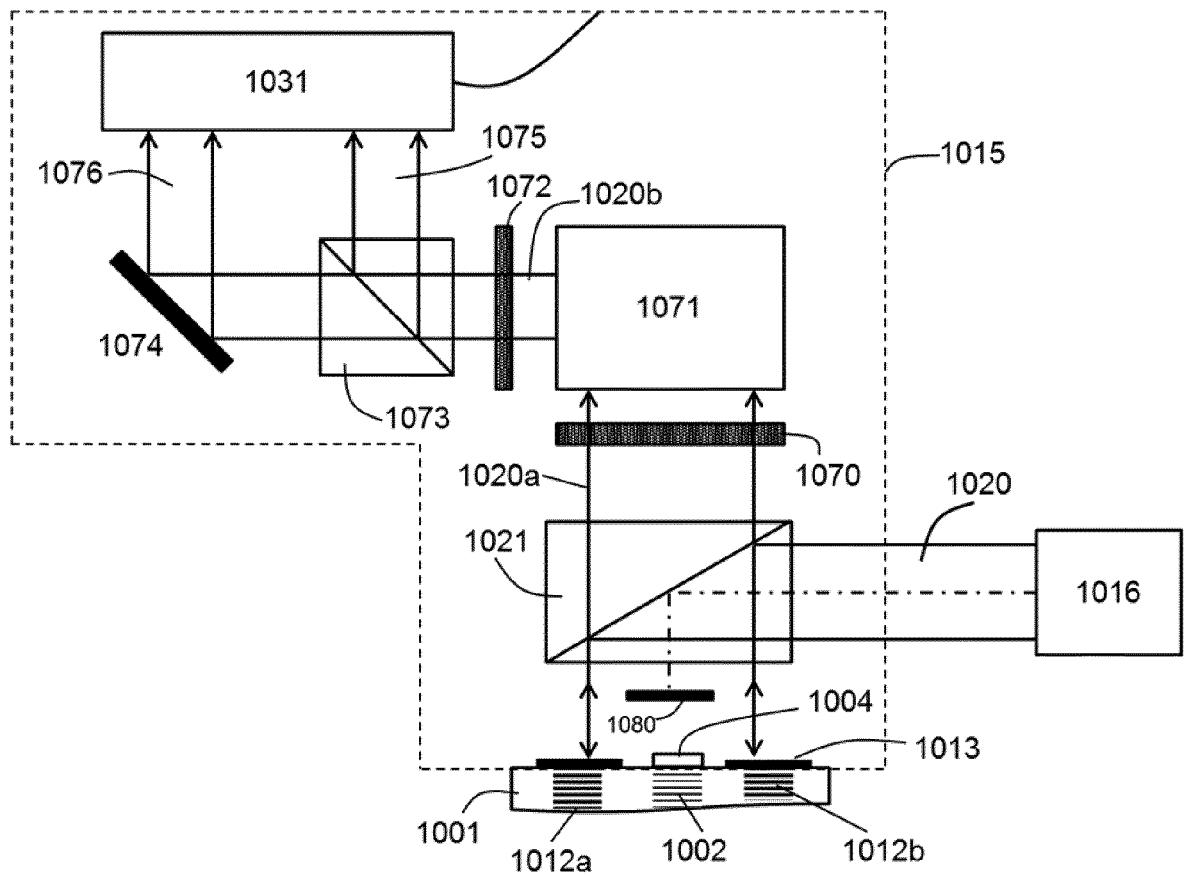
FIG. 11a depicts a schematic view of an embodiment of an optical detector according to the invention.

FIG. 11a depicts an embodiment of an optical detector 1015 comprising a self-referencing interferometer 1071. In this embodiment, a radiation beam 1020 that is generated by a radiation source 1016 is projected by an optical component 1021 onto a optically reflective member 1013, which may be used to measure a mechanical displacement of a optically reflective member 1013 in response to one or more diffracted acoustic waves 1012a, 1012b transmitted by a lens assembly 1001. It will be appreciated by the skilled person that the optically reflective member 1013 may comprise a Fabry-Pérot cavity, which enhances the detection sensitivity of the optical detector 1015.

A beam blocker 1080 may be placed in the optical path of radiation beam 1020 in front of a transducer 1004, to prevent reflection of radiation from the transducer towards surrounding optical elements within the optical detector 1015, which may disturb the measurement. The beam blocker 1080 may be arranged to create a hollow radiation beam. It may be convenient to create a hollow circular radiation beam that impinges on the optically reflective member 1013.

Radiation reflected by the optically reflective member 1013, forming a reflected radiation beam 1020a, propagates through the optical component 1021 and a first half-wave plate 1070 towards the self-referencing interferometer 1071. Interferometer 1071 splits the reflected radiation beam 1020a into two parts with mutually orthogonal polarizations, rotates these parts around the optical axis by 180° relative to one other, and combines them into an outgoing radiation beam 1020b. The outgoing radiation beam 1020b exits the self-referencing interferometer 1071 and propagates through a second half-wave plate 1072, after which an optical component, for example a polarizing beam splitter, 1073 splits the radiation beam 1020b into a first beam 1075 and a second beam 1076, respectively. The first beam 1075 contains the difference of the two rotated radiation parts, and the second beam 1076 contains the sum of the two rotated radiation parts.

First and second radiation beams 1075, 1076 are detected by a detector 1031, which may comprise one or more light sensitive detectors such as photodiodes or image sensors. The detector 1031 may be coupled to a processor to receive measurement information signals for further analysis and/or control.

In some embodiments, optical fibers may be used to collect and to direct the first and the second radiation beams 1075, 1076 to the detector 1031.

In another embodiment, radiation source 1016 generates a radiation beam 1020 with some diversity in colour and/or polarization, for example radiation with a wavelength in the range of 400 to 900 nm. To split both the first 1075 radiation beam and the second radiation beam 1076 into multiple beams, each having a different wavelength corresponding to the aforesaid diversity, detector 1031 may comprise an optical de-multiplexer. The optical de-multiplexer comprises optical components, for example dichroic mirrors and/or optical fibers, that are arranged to separate light of different wavelengths into separate bands. De-multiplexed radiation beams may sequentially be detected by one or more light sensitive detectors.

In an embodiment, the lens assembly 1001 comprises two or more lenses arranged coaxially having a common axis. Crosstalk between the acoustic waves 1002 and the diffracted acoustic waves 1012a, 1012b may be reduced or prevented.

Figure 11B:
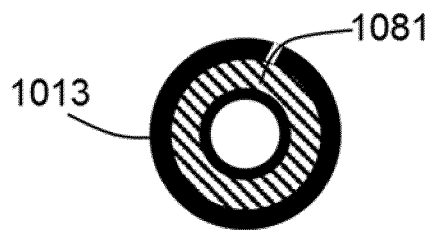
FIG. 11b is a schematic top view showing an illuminated area of a reflective optical member.

FIG. 11b depicts an illustrative top view of the lens assembly, showing a circular area 1081 illuminated by the hollow circular radiation beam 1020.

In an embodiment, the sensor 100 may comprise one or more capacitive detection members arranged to detect mechanical displacements in response to the received acoustic waves. The one or more capacitive detection members may be used separately or in combination with one or more optical reflective members 113.

A metrology apparatus comprising at least one sensor 100 according to the invention may be applied to acquire the information of one or more metrology targets provided at a substrate, e.g., metrology marks, in order to obtain overlay information of the layers that correlate to the measured metrology marks. The metrology apparatus may comprise a controller configured for causing the at least one sensor 100 to acquire the information, for example position information, of one or more targets. For example by controlling a position of a substrate support relatively to the sensor, herewith scanning the substrate and target. In addition, the target position information may be used to generate a wafer grid map. This wafer grid map may be used in a lithographic apparatus LA for a next exposure step as a feedforward control, whether in combination with a wafer grid map based on an alignment sequence in the lithographic apparatus LA or not.

In an embodiment, a system comprises a lithographic apparatus LA and a metrology apparatus. The system includes at least one position sensor according to the invention. Herewith, either the lithographic apparatus LA or the metrology apparatus or both the lithographic apparatus LA and the metrology apparatus are capable of acquiring position information of one or more targets provided at one or more layers.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus (for example to obtain overlay information), or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the clauses set out below.

1. A sensor comprising:
   a transducer configured to generate acoustic waves;
   a lens assembly configured to transmit and direct the acoustic waves to a target, and to receive at least a part of the acoustic waves, after interaction with the target; and
   an optical detector that comprises at least one optically reflective member arranged to receive the at least part of the acoustic waves,
   wherein the at least one optically reflective member is arranged to be mechanically displaced in response to the received acoustic waves.
2. The sensor according to clause 1, further comprising at least one radiation source configured to illuminate the at least one optically reflective member.
3. The sensor according to any preceding clause, wherein the lens assembly comprises:
   a first lens configured to direct the acoustic waves to the target, and
   a second lens configured to receive at least a portion of the acoustic waves after interaction with the target.
4. The sensor according to any preceding clause, wherein the lens assembly comprises a plurality of lenses arranged to have a common geometrical axis.
5. The sensor of any preceding clause, wherein the at least one radiation source is arranged to provide and to direct a reference beam along a radiation beam reference path in the optical detector.
6. The sensor according to any preceding clause, wherein the optical detector comprises an optical interferometer configured to detect the mechanical displacement of the at least one optically reflective member.
7. The sensor according to any one of clauses 1 to 4, wherein the optical detector comprises a self-referencing interferometer configured to detect the mechanical displacement of the at least one optically reflective member.
8. The sensor according to any preceding clause, wherein the optical detector comprises at least one Fabry-Pérot cavity configured to detect the mechanical displacement of the at least one optically reflective member.
9. The sensor according to clause 8, wherein the at least one Fabry-Pérot cavity comprises a dielectric medium.
10. The sensor according to clauses 8 and/or 9, wherein the at least one Fabry-Pérot cavity is configured to change a geometrical dimension of the cavity in a direction along an optical axis.
11. The sensor according to any preceding clause, wherein the lens assembly has a tapered shape.

12. The sensor of clause 1, further comprising at least one capacitive detection member arranged to detect mechanical displacements in response to the received acoustic waves.

13. A lithography system comprising at least one sensor according any one of preceding clauses and a controller configured for causing the at least one sensor to acquire information of one or more targets for using the acquired information of the one or more target to control the positioning of the target.

14. A metrology system comprising the sensor of any one of clauses 1 to 11 configured to acquire information of one or more targets for using the acquired information of the one or more targets to obtain overlay information.

15. A system comprising the lithographic apparatus according clause 13 and the metrology apparatus according clause 14.

16. A method for obtaining information of a target provided at an object, the method comprising the steps of:
irradiating the object with acoustic waves,
receiving at least a portion of the acoustic waves reflected from the target,
measuring a mechanical displacement of at least one optically reflective member induced by the received acoustic waves, and
deriving characteristics of the target from the measured mechanical displacement.

17. The method of clause 16, wherein the method further comprises:
moving the target and sensor relatively to each other to scan the acoustic waves over the target in at least one direction across a surface of the object.

The invention claimed is:

1. A sensor comprising:
a transducer configured to generate acoustic waves;
a lens assembly configured to transmit and direct the acoustic waves to a target, and to receive at least a part of the acoustic waves, after interaction with the target;
an optical detector that comprises at least one optically reflective member arranged to receive the at least part of the acoustic waves, wherein the at least one optically reflective member is arranged to be mechanically displaced in response to the received acoustic waves; and
at least one radiation source configured to illuminate the at least one optically reflective member, wherein the at least one radiation source is arranged to provide and to direct a reference beam along a radiation beam reference path in the optical detector.

2. The sensor of claim 1, wherein the lens assembly comprises:
a first lens configured to direct the acoustic waves to the target, and
a second lens configured to receive at least a portion of the acoustic waves after interaction with the target.

3. The sensor of claim 1, wherein the lens assembly comprises a plurality of lenses arranged to have a common geometrical axis.

4. The sensor of claim 1, wherein the optical detector comprises an optical interferometer configured to detect the mechanical displacement of the at least one optically reflective member based on the illumination by the at least one radiation source.

5. The sensor of claim 1, wherein the optical detector comprises a self-referencing interferometer configured to detect the mechanical displacement of the at least one optically reflective member based on the illumination by the at least one radiation source.

6. The sensor of claim 1, wherein the optical detector comprises at least one Fabry-Perot cavity configured to detect the mechanical displacement of the at least one optically reflective member based on the illumination by the at least one radiation source.

7. The sensor according claim 6, wherein the at least one Fabry-Perot cavity comprises a dielectric medium.

8. The sensor of claim 6, wherein the at least one Fabry-Perot cavity is configured to change a geometrical dimension of the cavity in a direction along an optical axis.

9. The sensor of claim 1, wherein the lens assembly has a tapered shape.

10. A lithography system comprising:
a sensor comprising:
a transducer configured to generate acoustic waves;
a lens assembly configured to transmit and direct the acoustic waves to a target, and to receive at least a part of the acoustic waves, after interaction with the target; and
an optical detector that comprises at least one optically reflective member arranged to receive the at least part of the acoustic waves, wherein the at least one optically reflective member is arranged to be mechanically displaced in response to the received acoustic waves; and
at least one radiation source configured to illuminate the at least one optically reflective member, wherein the at least one radiation source is arranged to provide and to direct a reference beam along a radiation beam reference path in the optical detector.

11. A metrology system comprising:
a sensor comprising:
a transducer configured to generate acoustic waves;
a lens assembly configured to transmit and direct the acoustic waves to a target, and to receive at least a part of the acoustic waves, after interaction with the target;
an optical detector that comprises at least one optically reflective member arranged to receive the at least part of the acoustic waves, wherein the at least one optically reflective member is arranged to be mechanically displaced in response to the received acoustic waves; and
at least one radiation source configured to illuminate the at least one optically reflective member, wherein the at least one radiation source is arranged to provide and to direct a reference beam along a radiation beam reference path in the optical detector,
wherein the metrology system is configured to acquire information of one or more of the targets and to use the information of the one or more of the targets to obtain overlay information.

12. A method comprising:
irradiating an object with acoustic waves,
receiving, at a sensor, at least a portion of the acoustic waves reflected from a target, wherein the senor comprises an optical detector that comprises at least one optically reflective member arranged to receive the at least a portion of the acoustic waves reflected from the target, wherein the at least one optically reflective member is arranged to be mechanically displaced in response to the received acoustic waves;
illuminating with illumination the at least one optically reflective member using at least one radiation source that is also arranged to provide and to direct a reference beam along a radiation beam reference path in the optical detector;

measuring the mechanical displacement of the at least one optically reflective member induced by the received acoustic waves using the illumination, and deriving characteristics of the target from the measured mechanical displacement.

13. The method of claim 12, wherein the method further comprises:

moving the target and the sensor relatively to each other to scan the acoustic waves over the target in at least one direction across a surface of the object.

* * * * *

UNITED STATES PATENT AND TRADEMARK OFFICE
CERTIFICATE OF CORRECTION

PATENT NO. : 11,927,891 B2
APPLICATION NO. : 16/963273
DATED : March 12, 2024
INVENTOR(S) : Pandey et al.

It is certified that error appears in the above-identified patent and that said Letters Patent is hereby corrected as shown below:

In the Specification

In Column 4, Line 44, delete "2," and insert -- 2; --, therefor.

In Column 4, Line 67, after "invention;", insert -- and --.

In Column 8, Line 4, delete "an" and insert -- a --, therefor.

In Column 12, Line 66, delete "supress" and insert -- suppress --, therefor.

In Column 14, Line 57, delete "81" and insert -- $\theta1$ --, therefor.

In Column 14, Line 58, delete "82," and insert -- $\theta2$, --, therefor.

In Column 15, Line 6, delete "81" and insert -- $\theta1$ --, therefor.

In Column 15, Line 6, delete "82" and insert -- $\theta2$ --, therefor.

In the Claims

In Column 20, Claim 7, Line 9, after "according", insert -- to --.

Signed and Sealed this
Thirtieth Day of April, 2024

Katherine Kelly Vidal
*Director of the United States Patent and Trademark Office*